United States Patent
Laskaris et al.

(10) Patent No.: US 8,374,663 B2
(45) Date of Patent: Feb. 12, 2013

(54) COOLING SYSTEM AND METHOD FOR COOLING SUPERCONDUCTING MAGNET DEVICES

(75) Inventors: Evangelos Trifon Laskaris, Schenectady, NY (US); James Pellegrino Alexander, Ballston Lake, NY (US); Paul St. Mark Shadforth Thompson, Stephentown, NY (US); Tao Zhang, Clifton Park, NY (US); William Chen, Florence, SC (US); Longzhi Jiang, Florence, SC (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/017,481

(22) Filed: Jan. 31, 2011

(65) Prior Publication Data

US 2012/0196753 A1 Aug. 2, 2012

(51) Int. Cl.
*H01F 6/06* (2006.01)
(52) U.S. Cl. ..................................................... 505/163
(58) Field of Classification Search .......... 62/51.1, 62/45.1; 505/100, 163, 166
See application file for complete search history.

(56) References Cited

U.S. PATENT DOCUMENTS

| | | | | |
|---|---|---|---|---|
| 4,782,671 A * | 11/1988 | Breneman et al. | | 62/51.1 |
| 5,291,739 A * | 3/1994 | Woods et al. | | 62/48.1 |
| 5,842,348 A * | 12/1998 | Kaneko et al. | | 62/51.1 |
| 6,967,480 B2 | 11/2005 | Nemoto et al. | | |
| 7,319,329 B2 * | 1/2008 | Huang et al. | | 324/319 |
| 7,559,205 B2 * | 7/2009 | Atkins et al. | | 62/51.1 |
| 2004/0244386 A1* | 12/2004 | Penn et al. | | 62/50.2 |
| 2006/0236709 A1* | 10/2006 | Steinmeyer | | 62/259.2 |
| 2006/0288731 A1* | 12/2006 | Atkins et al. | | 62/457.9 |
| 2007/0062203 A1* | 3/2007 | Hasselt | | 62/51.1 |
| 2007/0108979 A1 | 5/2007 | Ryan et al. | | |
| 2008/0148756 A1* | 6/2008 | Oomen et al. | | 62/259.2 |
| 2010/0051307 A1* | 3/2010 | Tigwell et al. | | 174/15.5 |
| 2010/0089073 A1* | 4/2010 | Laskaris et al. | | 62/51.1 |
| 2011/0301038 A1* | 12/2011 | Stautner et al. | | 505/100 |

FOREIGN PATENT DOCUMENTS

GB 2301174 A * 11/1996
GB 2427672 A 1/2007

OTHER PUBLICATIONS

Ackermann et al, "Advanced Cryocooler Cooling for MRI Systems", Chemistry and Materials Science, vol. 15, pp. 857-867, 1999.

* cited by examiner

*Primary Examiner* — Colleen Dunn
(74) *Attorney, Agent, or Firm* — The Small Patent Law Group; Evan Reno Sottriou; Marie-Claire B. Maple

(57) ABSTRACT

A cooling system and method for cooling superconducting magnet coils are provided. One magnet system for a superconducting magnet device includes a cooling system having at least one coil support shell, a plurality of superconducting magnet coils supported by the at least one coil support shell and a plurality of cooling tubes thermally coupled to the at least one coil support shell. The magnet system also includes a cryorefrigerator system fluidly coupled with the plurality of cooling tubes forming a closed circulation cooling system.

22 Claims, 4 Drawing Sheets

COOLING SYSTEM AND METHOD FOR COOLING SUPERCONDUCTING MAGNET DEVICES

BACKGROUND OF THE INVENTION

The subject matter disclosed herein relates generally to superconducting magnet devices, and more particularly to systems and methods for cooling superconducting magnets, especially in Electrical Machines, Magnetic Storage and Magnetic Resonance Imaging (MRI) systems.

Superconducting coils, for example superconducting coils forming magnet device, are typically cryogenically cooled using a helium vessel. In these conventional magnet devices, the superconducting coils are cooled in a bath of liquid Helium (He), such that the coils are immersed in the liquid He. This cooling arrangement requires the use of an extremely large high pressure vessel that contains thousands of liters of liquid He. The resulting structure is not only expensive to manufacture, but heavy. In many situations reinforcement of the floor on which the magnet device is placed is needed, as well as the use of cranes to install the magnet device because typical elevators cannot support the weight of these magnet devices, such as MRI systems. Additionally, there are many areas (e.g., underserved or underdeveloped regions) where liquid helium delivery and service is not available. Accordingly, conventional magnet devices cannot be installed in these locations.

Additionally, the liquid He in these systems can sometimes boil-off, such as during a quench event, wherein the boiled-off helium escapes from the cryogen bath in which the magnet coils are immersed. Each quench, followed by a re-fill and re-ramp of the magnet, is an expensive and time consuming event. Additionally, in conventional superconducting magnet devices, an exterior venting system is needed to vent the gas, such as boiled-off helium, through venting pipes after magnet quenches. The venting pipes are difficult to install, and in some instances, impossible to install. Thus, added cost results, and in some situations, the venting of helium can have environmental or regulatory concerns.

Thus, conventional cooling arrangements for magnet devices can result in special installation requirements, the inability to install these systems in certain regions and a high cost to maintain.

BRIEF DESCRIPTION OF THE INVENTION

In accordance with various embodiments, a magnet system for a superconducting magnet device is provided that includes at least one coil support shell, a plurality of superconducting magnet coils supported by the at least one coil support shell and a plurality of cooling tubes thermally coupled to the at least one coil support shell. The magnet system also includes a cryorefrigerator system fluidly coupled with the plurality of cooling tubes forming a closed circulation cooling system.

In accordance with other embodiments, a magnet system for a superconducting magnet device is provided that includes a plurality of superconducting magnet coils supported by at least one coil support shell having a plurality of cooling tubes thermally coupled to the coil support shell and forming a second stage of a cryorefrigeration system. The magnet system further includes a thermal shield thermally coupled to a first stage of the cryorefrigeration system. The magnet system also includes a hermetically sealed liquid helium tank and a helium gas tank connected to the plurality of cooling tubes.

In accordance with yet other embodiments, a magnet system for a superconducting magnet device is provided that includes at least one coil support shell, a plurality of superconducting magnet coils supported by the at least one coil support shell and a plurality of cooling tubes thermally coupled to the at least one coil support shell. The magnet system also includes a non-venting cryorefrigerator system fluidly coupled with the plurality of cooling tubes.

DETAILED DESCRIPTION OF THE INVENTION

Figure 1:
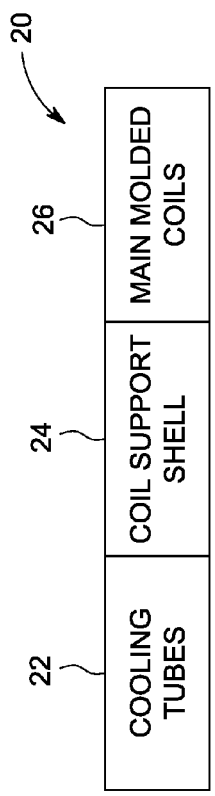
FIG. 1 is a simplified block diagram of a cooling arrangement formed in accordance with various embodiments for cooling a superconducting magnet.

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware. Thus, for example, one or more of the functional blocks may be implemented in a single piece of hardware or multiple pieces of hardware. It should be understood that the various embodiments are not limited to the arrangements and instrumentality shown in the drawings. Additionally, the system blocks in the various figures may be rearranged or reconfigured.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide systems and methods for cooling superconducting magnets, particularly for reducing heat transferred to the coils of superconducting magnets, such as during power off, energization or steady state operation thereof. For example, various embodiments provide cooling of superconducting magnet devices, such as cooling the superconducting magnets for Electrical Machines, Magnetic Storage, and/or Magnetic Resonance Imaging (MRI) systems By practicing at least one of the embodiments, less liquid helium (He) is needed for cooling the superconducting magnets, such as of a MRI system, which reduces the weight of the MRI system and relaxes the installation requirements for these systems. Additionally, the amount of He that may be lost is reduced by practicing at least one embodiment.

In general, various embodiments include a cooling system (which may be a two-stage system) for cooling superconducting magnet devices, which include superconducting coils, such as the superconducting coils of an MRI system. The cooling system includes a cryorefrigerator that provides cooling using a helium thermosiphon system, which in various embodiments is a closed loop system. Accordingly, in some embodiments a non-venting (or very high pressure setting venting) cryorefrigeration arrangement is provided. In various embodiments, a magnet system is also provided that includes a hermetically sealed liquid helium tank, such that in various embodiments an air tight seal is provided at the cooling fluid port to prevent air or gas from passing therethrough after the magnet device has been filled with the cooling fluid.

It should be noted that although various embodiments may be described in connection with superconducting magnets for MRI systems, the various embodiments may be implemented in connection with any type of system having superconducting magnets, such as any type of superconducting magnet device. The superconducting magnets also may be implemented in other types of medical imaging devices, as well as non-medical imaging devices.

FIG. 1 illustrates a simplified diagram of a cooling arrangement 20 for cooling a superconducting magnet formed in accordance with various embodiments. The cooling arrangement 20 in various embodiments is configured as a helium thermosiphon system that includes cooling tubes 22, or other suitable cooling paths, with He circulating within the cooling tubes 22 cooled using a cryorefrigerator. The cooling tubes 22 are thermally coupled to one or more coil support shells 24 that support or maintain the position of the MRI magnet coils, which in the illustrated embodiment are main molded coils 26 of the MRI system. For example, the main molded coils 26 may be shrink fit and bonded inside the one or more coil support shells 24, which may be cylindrical metal coil support shells, to thereby provide thermal contact therebetween. Other types of coils 26 may be provided, for example, epoxied coils.

Figure 2:
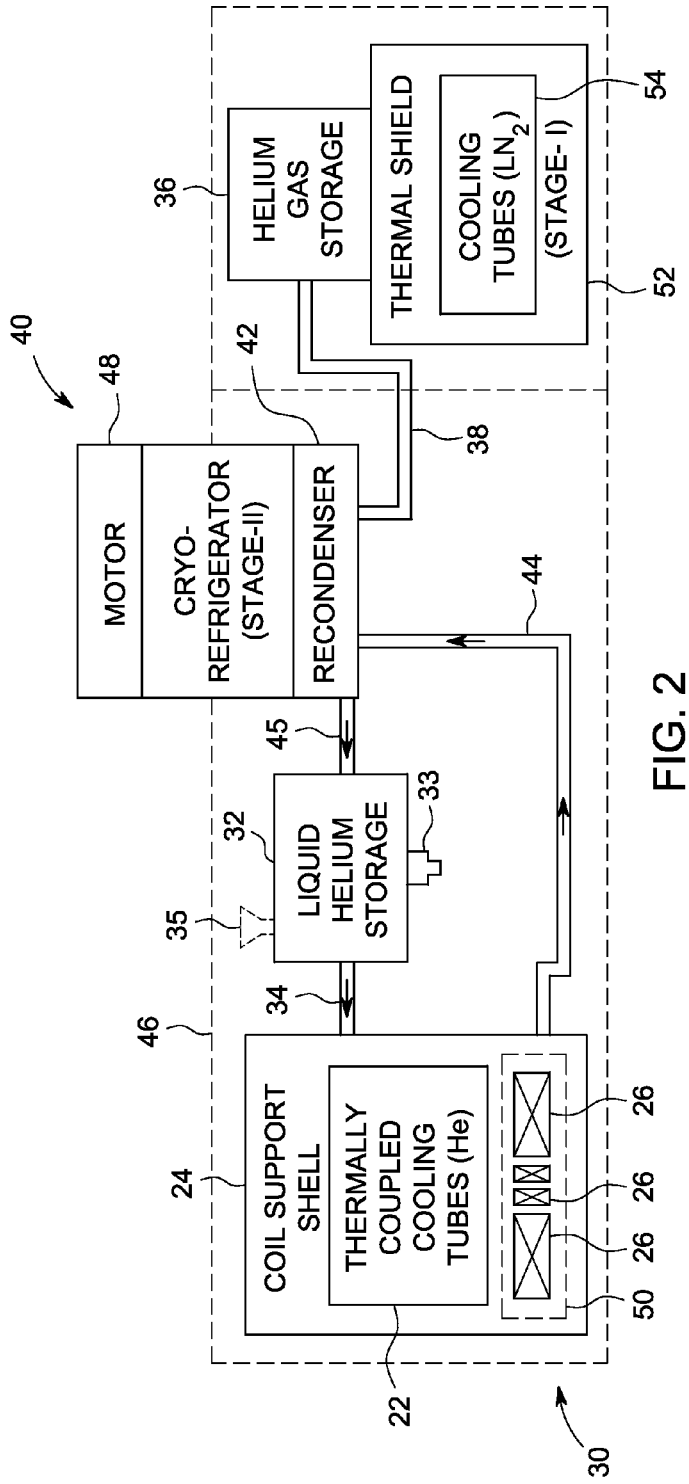
FIG. 2 is a block diagram of a magnetic resonance imaging (MRI) magnet system formed in accordance with various embodiments illustrating a cooling arrangement.

The various embodiments may be implemented as part of an MRI magnet system 30 as illustrated in the block diagram of FIG. 2, wherein the cooling is provided via a two stage cooling arrangement. It should be noted that like numerals represent like parts throughout the Figures. FIG. 2 generally illustrates the cooling fluid paths and two-stage cooling arrangement.

The coil support shell 24, which is formed from a thermally conductive material (e.g. aluminum), provides a cold mass support structure that maintains the position of or supports the magnet coils 26. The cooling tubes 22, which may be formed from any suitable metal (e.g., copper, stainless steel, aluminum, etc.), are in fluid communication with a liquid He storage system 32, which may be formed from a plurality of liquid He storage tanks. The liquid He storage system 32 contains the liquid He used in a closed loop cooling system to cool the magnet coils 26 of the MRI magnet system 30. The fluid communication between the cooling tubes 22 and the liquid He storage system 32 may be provided via one or more fluid passageways 34 (e.g., fluid tubes, conduits, etc.). Thus, the liquid He storage system 32 provides the liquid He that flows through the cooling tubes 22 to cool the magnet coils 26.

In various embodiments, an inlet port is provided for providing the liquid cryogen, for example, the liquid He, into the cooling arrangement 20. In one embodiment, as illustrated in FIG. 2, a cryogen inlet port 33 is provided as part of the liquid helium storage system 32. The cryogen inlet port 33 provides a hermetically sealed configuration such that a closed-loop cooling system is provided wherein air tight seal prevents (or significantly limits) air or gas from passing therethrough after the magnet device has been filled with the cooling fluid, for example, liquid He. For example, the air tight seal prevents oxygen, moisture, humidity, and any/or outside contaminants from entering the sealed closed-loop cooling arrangement, as well as preventing the coolant from being released from the system. However, any type of suitable sealing arrangement may alternatively be provided.

In the illustrated embodiment, the cooling arrangement 20 includes no venting. However, in some embodiments venting may optionally be provided, for example, using a vent 35 having a very high venting pressure level, which is substantially higher than a conventional vent, such that venting of, for example, boiled-off helium only occurs at pressure levels higher that the pressure level range for normal venting systems. For example, in some embodiments the vent 35 is configured to provide venting at the highest pressure that the system can handle with out failure (or within a predefined range thereof). However, different pressure levels may be provided in embodiments that include the vent 35, which may be based on system requirements, regulatory requirements, etc. Thus, in some embodiments, a cryorefrigerator system includes the vent 35 having a venting pressure higher than a normal boil-off venting level or normal quench event venting level.

The cooling tubes 22 are also in fluid communication with a vapor return manifold 44, which is in fluid communication with a He gas storage system 36 through a recondenser 42. The He gas storage system 36, which may be formed from one or more He gas storage tanks (e.g., two toroidal shaped tanks), contains He gas received as He vapor from the cooling tubes 22 that removes the heat from the magnet coils 26 and forms part of the closed loop cooling system. The fluid communication between the recondenser 42 and the He gas storage system 36 may me provided via one or more passageways 38.

The He gas storage system 36 is in fluid communication with a cryorefrigerator 40 that includes a recondenser 42, which fluid communication may be provided via one or more fluid passageways 38. In various embodiments, the recondenser 42 draws He gas from the He gas storage system 36 that operates to form a free convection circulation loop to cool the magnet coils 26 and coil support shell 24 to a cryogenic temperature, as well as fills the liquid He storage system 32 with liquid He via one or more passageways 45. In various embodiments, the liquid He storage system 32 includes about 8-10 liters of liquid He. The liquid He in the liquid He storage system 32 may be used to provide cooling of the magnet coils 26 during power interruptions or shut down of the cryorefrigerator 40, such as for service (e.g., for 10-12 hours).

The cryorefrigerator 40, which may be a coldhead or other suitable cryocooler, extends through a vacuum vessel 46, which contains therein the MRI magnet system 30 and the cooling components of the various embodiments. The cryorefrigerator 40 may extend within a sleeve or housing (not shown). Thus, the cold end of the cryorefrigerator 40 may be positioned within the sleeve without affecting the vacuum within the vacuum vessel 46. The cryorefrigerator 40 is inserted (or received) and secured within the sleeve using any suitable means, such as one or more flanges and bolts, or other suitable means. Moreover, a motor 48 of the cryorefrigerator 40 is provided outside the vacuum vessel 46.

As illustrated in FIG. 2, the cryorefrigerator 40 in various embodiments includes the recondenser 42 at a lower end of the cryorefrigerator 40 that recondenses boiled off helium gas received from the vapor return manifold 44 in parallel with the He gas storage system 36. The recondenser 42 allows for transferring boiled off helium gas from the He gas storage system 36 to the liquid He storage system 32.

The magnet coils 26, which in various embodiments are molded coils, form a main superconducting magnet 50 that is controlled during operation of the MRI system as described in more detail herein to acquire MRI image data. Additionally, during operation of the MRI system, liquid He cools the superconducting magnet 50. The superconducting magnet 50 may be cooled, for example, to a superconducting temperature, such as 4.2 Kelvin (K). The cooling process may include the recondensing of boiled off helium gas to liquid by the recondenser 42 and returned to the liquid He storage system 32 as described herein.

The various embodiments also provide a thermal shield 52, which may be in thermal contact with the He gas storage system 36. In various embodiments, the MRI magnet system 30 and the cooling components of the various embodiments are provided within the vacuum vessel 46 (e.g., a steel vacuum vessel) that includes the thermal shield 52 therein and/or therebetween. The thermal shield 52 is thermally coupled to a plurality of cooling tubes 54 (e.g., pre-cooling tubes), which in various embodiments are different than and not in fluid communication with the cooling tubes 22. For example, the cooling tubes 22 provide cooling using He and the cooling tubes 54 may provide cooling, or pre-cooling, using liquid nitrogen ($LN_2$). Thus, the thermal shield 52 with the cooling tubes 54 may operate as a thermally isolating radiation shield with convection cooling.

In various embodiments, a multi-stage cooling arrangement in provided, which is illustrated as a two-stage cooling arrangement. In particular, cooling with the thermal shield 52 may provide a first stage of cooling, for example, at a temperature between about 77K and 80K using the $LN_2$, which may provide pre-cooling, such as when the MRI system is installed or first turned on. The second stage of cooling is provided using the He cooling and may provide cooling during steady state operation and or during power out conditions, allowing for a "ride-through" mode to provide an operation temperature of about 4.2K. Thus, the cooling arrangement for cooling the magnet coils 26 in various embodiments operates in a refrigerator type manner and also allows for boiling of He during power off conditions (e.g., 5-10 hours of power off), which also allows for the MRI system to be turned off before magnet quench.

Figure 3:
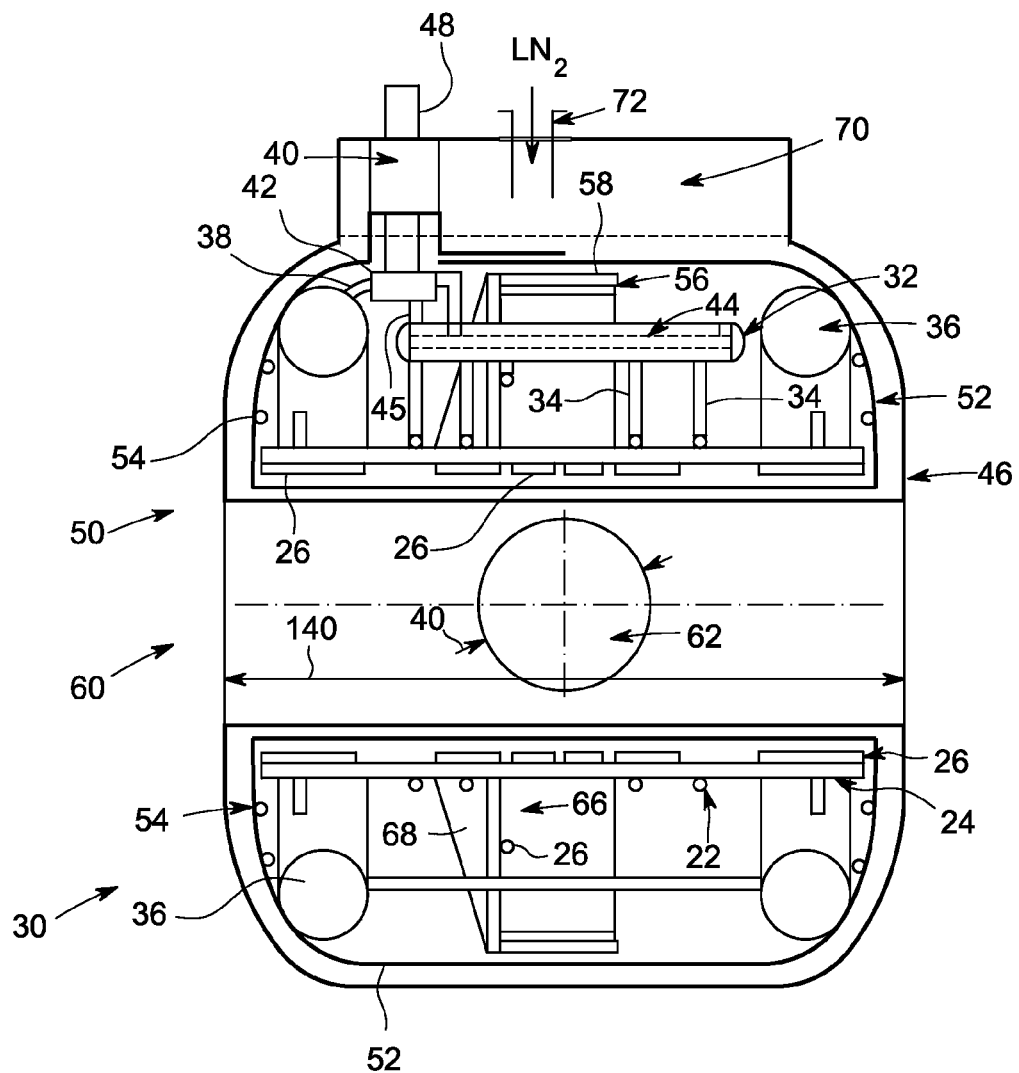
FIG. 3 is a side schematic view of an MRI magnet system illustrating a cooling arrangement formed in accordance with various embodiments.

One configuration of an MRI magnet system 30 is illustrated in FIG. 3. In various embodiments, the MRI magnet system 30 is a low cryogen MRI magnet arrangement providing cryorefrigeration as described in more detail herein. In this embodiment, the MRI magnet system 30 includes a superconducting MRI magnet 50 formed from concentric superconducting main coils 26 and bucking coils 56 supported inside cylindrical shells (the coil support shell 24 and a coil support shell 58) of high thermal conductivity, and cooled by the cryorefrigerator 40 through a helium thermosiphon system. Thus, there is radial spacing between the superconducting main coils 26 and bucking coils 56 in various embodiments, which are each supported on different coil support shells 24 and 58, respectively. In various embodiments, the coil support shell 24 a coil support shell 58 are formed as cylindrical shells, such as formed from metal, with the cooling tubes 22 thermally coupled (e.g., bonded) to an outside surface of the coil support shell 24. For example, the support shell 24 and coil support shell 58 may have circumferentially extending solid metal walls that define a bore therein.

The superconducting coils 26 and/or 56 in various embodiments are molded with epoxy resin. For example, the molded coils may be wound with wet epoxy and cured to form self-supporting structures. The superconducting coils 26 and/or 56 then may be bonded to the coil support shells 24 and 58, respectively, for example, to the outer surface of the coil support shells 24 and 58, which may be formed from aluminum. The formed superconducting coils 26 and/or 56 are sized to define a bore 60 therethrough which is used to image an object (e.g., a patient). For example, a field of view (FOV) 62 may be defined to image a particular portion of the object as described in more detail herein.

As can be seen, the helium thermosiphon arrangement includes an evaporator system with the plurality of the cooling tubes 22 thermally attached to the coil support shells 24 and/or 58, a recondenser 42 thermally attached to the cryorefrigerator 40, and He storage vessels (illustrated as tanks forming the liquid He storage system 32 and the He gas storage system 36), all contained inside the magnet vacuum vessel 46. The superconducting molded coils 26 and 56 are shrink fit and bonded inside the cylindrical support shells 24 and 58, respectively, in some embodiments to provide for good thermal contact.

Figure 4:
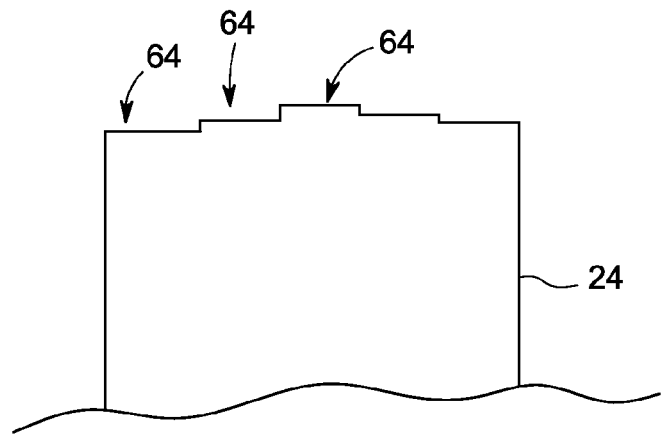
FIG. 4 is a side elevation view of coil support shell formed in accordance with one embodiment.

In various embodiments, the main coil support shell 24 has a plurality of radial steps 64 (e.g., a series of incremental steps), as illustrated in FIG. 4, to allow sequential assembly of the coils 26 axially, starting with the smaller coils 26 near or towards the center of the main coil support shell 24 and increasing in size with the larger coils 26 toward the ends of the main coil support shell 24 (with the coils 26 secured within the main coil support shell 24 (e.g., by bonding). The bucking coil support shell 58 in various embodiments is formed to support or house a single or a pair of bucking coils 56 near the mid-plane of the superconducting magnet 50. The bucking coil support shell 58 is connected to the main coil support shell 24 by a support member, illustrated as a disk 66 (e.g., stiffening ring) with stiffening gussets 68 that may be discrete components to reinforce the disk 66.

The helium thermosiphon system of various embodiments includes the He gas storage system 36, which contains about 200 to about 300 liters of He gas, which varies based on the amount of cooling needed or desired. In various embodiments, the He gas storage system 36 provides less than 260 liters of He gas at 30 atmosphere (atm). Additionally, the liquid He storage system 32 includes about 10 (or less) to about 40 liters of liquid He, and that receives liquid He from the recondenser 42, and supplies liquid He to the cooling tubes 22 coupled to the cold mass support structure, namely the coil support shells 24 and/or 58.

The manifold 44 receives vapor He (He gas) from the cooling tubes 22 and returns the He gas to the recondenser 42. In various embodiments, the He gas storage system 36 are charged initially with between 30 and 40 atm He gas at ambient temperature. In operation, when the cryorefrigerator 40 is turned on, the recondenser 42 draws He from the He gas storage system 36, and sets up a free convection circulation loop that cools down the coils 26 and 56 and support mass (the coil support shells 24 and/or 58) to a cryogenic temperature, as well as fills the liquid He storage system 32 with between about 8 and 10 liters of liquid He. In operation, the liquid He in the liquid He storage system 32 is used to provide cooling to the magnet 50, for example, during power interruptions, or shut down of the cryorefrigerator 40, such as for service, up to 10-12 hours. In various embodiments, once the thermosiphon system is turned on, the system cools itself, thereby forming a free convection circulation system.

It should be noted that the MRI magnet system 30 also includes a service box 70 receiving power leads 72 for powering the coils 26 and 56, as well as other components of the MRI magnet system 30 as described herein.

Thus, various embodiments provide an MRI magnet system having molded superconducting coils that are conduction cooled and structurally supported by high thermal conductivity cylindrical shells, which can operate at a temperature of 4.2K. Moreover, in various embodiments, the magnet weight is reduced by eliminating a large liquid He storage vessel that is typically used in superconducting magnets, and by making the coil support components out of aluminum. In various embodiments, no servicing or adding of cryogen is needed and the overall system weight is between about 2000 pounds and 2500 pounds.

Figure 5:
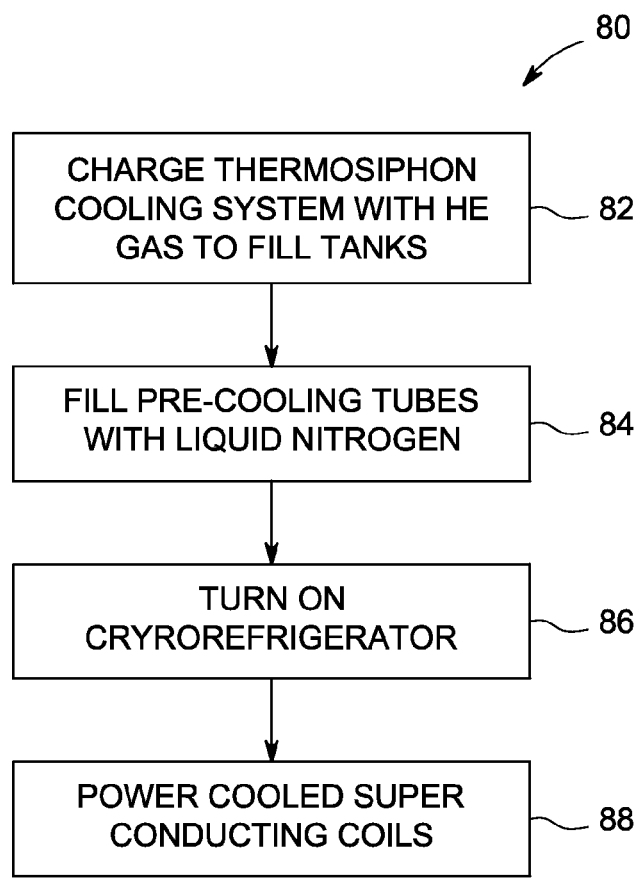
FIG. 5 is a flowchart of a method of cooling superconducting coils in accordance with various embodiments using a thermosiphon cooling system.

Moreover, a thermosiphon cooling system for superconducting magnets is also provided. The cooling with a two stage cooling system may be performed, for example, as illustrated in the method 80 shown in FIG. 5. The method 80 includes charging the thermosiphon cooling system with He gas to fill the tanks. For example, He storage tanks may be charged initially with 30-40 atm He gas at ambient temperature. Optionally, the pre-cooling tubes 54 may be flushed and eventually filled with liquid nitrogen ($LN_2$), which increases the rate at which the superconducting coils are initially cooled. After the initial cooling, the $LN_2$ may be removed (drained) from the system.

Thereafter, or at the same time, the cryorefrigerator is turned on at 86, which causes the recondenser to draw He from the storage tanks and sets up a free convection cooling circulation loop that cools down the coils and the support mass to cryogenic temperature. The liquid He storage tanks are filled with liquid He, which is used to provide cooling to the superconducting magnet, for example, during power interruption or system shut down.

The superconducting coils then may be powered on 88, such as to acquire MRI images of an object. For example, the cooled superconducting coils may be powered to generate a suitable MRI imaging field.

The various embodiments may be implemented in connection with different types of superconducting coils, such as superconducting coils for an MRI system. For example, the various embodiments may be implemented with superconducting coils for use with an MRI system 100 shown in FIG. 6. It should be appreciated that although the system 100 is illustrated as a single modality imaging system, the various embodiments may be implemented in or with multi-modality imaging systems. The system 100 is illustrated as an MRI imaging system and may be combined with different types of medical imaging systems, such as a Computed Tomography (CT), Positron Emission Tomography (PET), a Single Photon Emission Computed Tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

Figure 6:
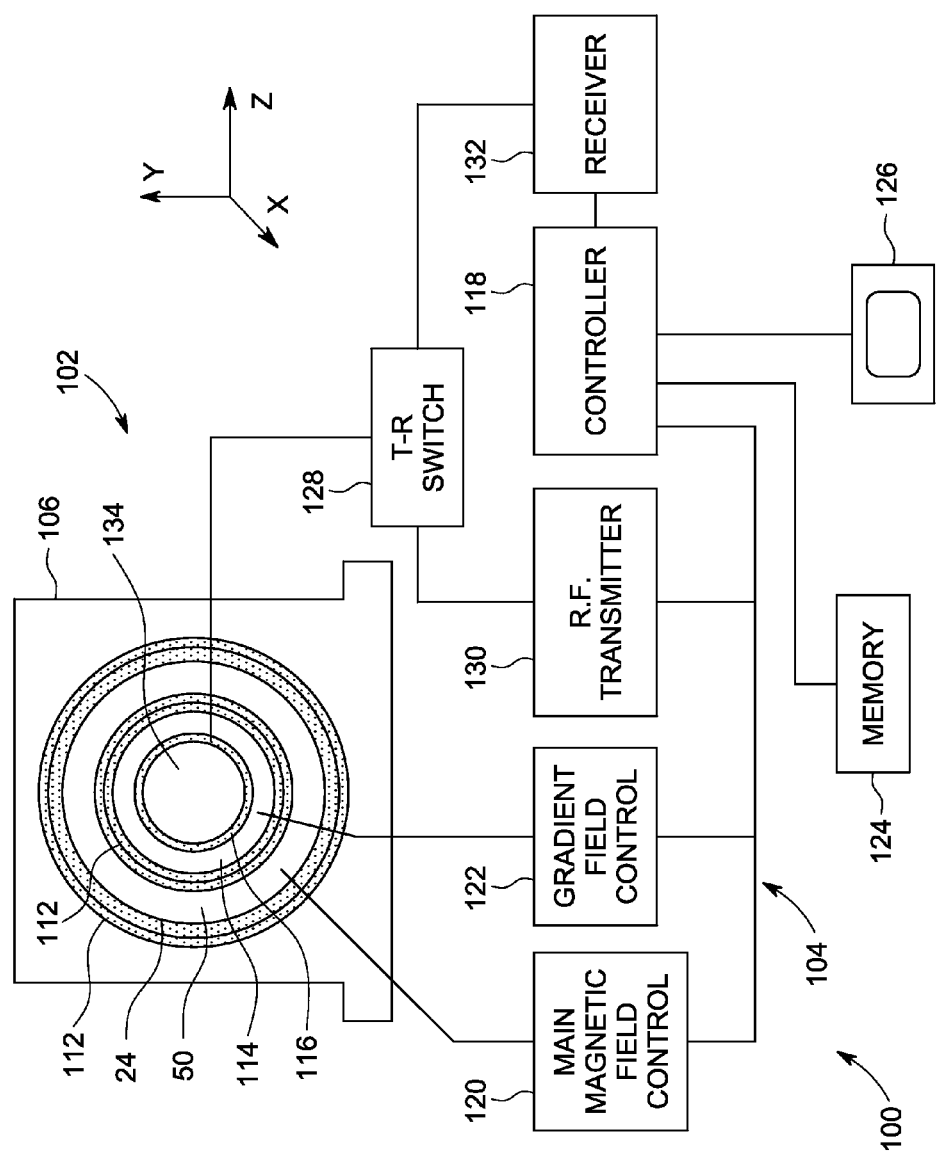
FIG. 6 is a block diagram of an MRI system in which a cooling arrangement formed in accordance with various embodiments may be implemented.

Referring to FIG. 6, the MRI system 100 generally includes an imaging portion 102 and a processing portion 104 that may include a processor or other computing or controller device. The MRI system 100 includes within a gantry 106 a superconducting magnet 50 formed from coils, for example, molded coils that are cooled as described herein. One or more He tanks 32 and/or 36 provide liquid He through cooling tubes 22 (all shown in FIGS. 1-3). A coil support shell 24 surrounds the superconducting magnet 50 and is thermally coupled to the cooling tubes 22. The liquid helium is used to cool the coils of the superconducting magnet 50, which includes providing the liquid helium to cooling tubes 22 as described in more detail herein. Thermal insulation 112 may be provided surrounding the outer surface of the coil support shell 24 and the inner surface of the superconducting magnet 50. A plurality of magnetic gradient coils 114 are provided inside the superconducting magnet 50 and an RF transmit coil 116 is provided within the plurality of magnetic gradient coils 114. In some embodiments, the RF transmit coil 116 may be replaced with a transmit and receive coil. The components within the gantry 106 generally form the imaging portion 102. It should be noted that although the superconducting magnet 50 is a cylindrical shape, other shapes of magnets can be used.

The processing portion 104 generally includes a controller 118, a main magnetic field control 120, a gradient field control 122, a memory 124, a display device 126, a transmit-receive (T-R) switch 128, an RF transmitter 130 and a receiver 132.

In operation, a body of an object, such as a patient or a phantom to be imaged, is placed in the bore 134 on a suitable support, for example, a patient table. The superconducting magnet 108 produces a uniform and static main magnetic field $B_o$ across the bore 134. The strength of the electromagnetic field in the bore 134 and correspondingly in the patient, is controlled by the controller 118 via the main magnetic field control 120, which also controls a supply of energizing current to the superconducting magnet 50.

The magnetic gradient coils 114, which include one or more gradient coil elements, are provided so that a magnetic gradient can be imposed on the magnetic field $B_o$ in the bore 134 within the superconducting magnet 108 in any one or more of three orthogonal directions x, y, and z. The magnetic gradient coils 114 are energized by the gradient field control 122 and are also controlled by the controller 118.

The RF transmit coil 116, which may include a plurality of coils, is arranged to transmit magnetic pulses and/or optionally simultaneously detect MR signals from the patient if receive coil elements are also provided, such as a surface coil configured as an RF receive coil. The RF receive coil may be of any type or configuration, for example, a separate receive surface coil. The receive surface coil may be an array of RF coils provided within the RF transmit coil 116.

The RF transmit coil 116 and the receive surface coil are selectably interconnected to one of the RF transmitter 130 or receiver 132, respectively, by the T-R switch 128. The RF transmitter 130 and T-R switch 128 are controlled by the controller 118 such that RF field pulses or signals are generated by the RF transmitter 130 and selectively applied to the patient for excitation of magnetic resonance in the patient. While the RF excitation pulses are being applied to the patient, the T-R switch 128 is also actuated to disconnect the receive surface coil from the receiver 132.

Following application of the RF pulses, the T-R switch 128 is again actuated to disconnect the RF transmit coil 116 from the RF transmitter 130 and to connect the receive surface coil to the receiver 132. The receive surface coil operates to detect or sense the MR signals resulting from the excited nuclei in the patient and communicates the MR signals to the receiver 132. These detected MR signals are in turn communicated to the controller 118. The controller 118 includes a processor (e.g., image reconstruction processor), for example, that controls the processing of the MR signals to produce signals representative of an image of the patient.

The processed signals representative of the image are also transmitted to the display device 126 to provide a visual display of the image. Specifically, the MR signals fill or form a k-space that is Fourier transformed to obtain a viewable image. The processed signals representative of the image are then transmitted to the display device 126.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A magnet system for a superconducting magnet device, the magnet system comprising:
    at least one coil support shell;
    a plurality of superconducting magnet coils supported by the at least one coil support shell;
    a plurality of cooling tubes thermally coupled to the at least one coil support shell; and
    a cryorefrigerator system fluidly coupled with the plurality of cooling tubes forming a closed circulation cooling system, wherein the cryorefrigerator system comprises at least one Helium gas tank and at least one liquid Helium tank.

2. The magnet system of claim 1, wherein the cryorefrigerator system comprises a non-venting system.

3. The magnet system of claim 1, wherein the cryorefrigerator system comprises a vent having a venting pressure higher than a normal boil-off venting level.

4. The magnet system of claim 1, wherein the Helium gas tank stores less than about 300 liters of Helium gas at about 30 atmosphere (atm).

5. The magnet system of claim 1, wherein the Helium gas tank is toroidal shaped and surrounds the at least one coil support shell.

6. The magnet system of claim 1, wherein the liquid Helium tank stores about 10 liters of liquid Helium.

7. The magnet system of claim 1, wherein the liquid Helium tank comprises a hermetically sealed inlet port.

8. The magnet system of claim 1, further comprising a thermal shield with pre-cooling tubes thermally coupled to the thermal shield.

9. The magnet system of claim 8, wherein the pre-cooling tubes contain liquid Nitrogen.

10. The magnet system of claim 1, wherein the at least one coil support shell comprises a thermally conductive cylindrical metal shell.

11. The magnet system of claim 1, wherein the at least one coil support shell is a magnet coil support comprising a plurality of radial steps configured to receive the plurality of superconducting coils, wherein at least two of the plurality of superconducting coils have different sizes.

12. The magnet system of claim 1, further comprising at least one non-main magnet coil.

13. The magnet system of claim 1, further comprising a bucking coil and wherein the plurality of superconducting coils comprise main magnet coils, wherein the main magnet coils and bucking coils are concentrically aligned and each supported by cylindrical support shells.

14. The magnet system of claim 13, further comprising a stiffening ring coupling the cylindrical support shells.

15. The magnet system of claim 1, wherein the plurality of superconducting coils comprises one of molded coils or epoxied coils.

16. The magnet system of claim 1, wherein the cryorefrigerator system comprises a cryocooler with a recondenser.

17. The magnet system of claim 1, further comprising a vapor return manifold connected to the plurality of cooling tubes.

18. A magnet system for a superconducting magnet device, the magnet system comprising:
    a plurality of superconducting magnet coils supported by at least one coil support shell;
    a plurality of cooling tubes thermally coupled to the coil support shell and forming a second stage of a cryorefrigeration system;
    a thermal shield forming a first stage of the cryorefrigeration system, wherein the cryorefrigeration system includes a vent having a venting pressure higher than a normal quench event venting level; and
    a hermetically sealed liquid helium tank and a helium gas tank connected to the plurality of cooling tubes.

19. The magnet system of claim 18, wherein a plurality of pre-cooling tubes are thermally coupled to the thermal shield and having liquid Nitrogen therein and the plurality of cooling tubes thermally coupled to the at least one coil support shell have liquid Helium therein.

20. The magnet system of claim 18, further comprising a bucking coil supported on a coil support shell and concentrically aligned with the plurality of superconducting magnet coils supported on the at least one coil support shell.

21. A magnet system for a superconducting magnet device, the magnet system comprising:
    at least one coil support shell;
    a plurality of superconducting magnet coils supported by the at least one coil support shell;
    a plurality of cooling tubes thermally coupled to the at least one coil support shell; and
    a non-venting cryorefrigerator system fluidly coupled with the plurality of cooling tubes, wherein the non-venting cryorefrigerator system comprises at least one Helium gas tank and at least one liquid Helium tank.

22. The magnet system of claim 21, wherein the at least one liquid Helium tank having a hermetically sealed inlet port.

* * * * *